(12) United States Patent
Garay et al.

(10) Patent No.: US 11,469,726 B2
(45) Date of Patent: Oct. 11, 2022

(54) HIGHLY EFFICIENT DUAL-DRIVE POWER AMPLIFIER FOR HIGH RELIABILITY APPLICATIONS

(71) Applicant: Georgia Tech Research Corporation, Atlanta, GA (US)

(72) Inventors: Edgar Felipe Garay, Atlanta, GA (US); Hua Wang, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days.

(21) Appl. No.: 17/685,662

(22) Filed: Mar. 3, 2022

(65) Prior Publication Data
US 2022/0224296 A1    Jul. 14, 2022

Related U.S. Application Data

(63) Continuation of application No. PCT/US2022/012068, filed on Jan. 12, 2022.
(Continued)

(51) Int. Cl.
*H03F 3/45* (2006.01)
*H03F 3/24* (2006.01)
(Continued)

(52) U.S. Cl.
CPC ......... *H03F 3/245* (2013.01); *H03F 1/0205* (2013.01); *H03F 1/32* (2013.01); *H03F 1/565* (2013.01);
(Continued)

(58) Field of Classification Search
CPC ....................................................... H03F 3/45
(Continued)

(56) References Cited

U.S. PATENT DOCUMENTS

| | | | |
|---|---|---|---|
| 7,362,174 B2* | 4/2008 | Cao ..................... | H03F 3/45704 330/253 |
| 8,981,853 B2* | 3/2015 | Eyssa .................. | H03F 3/45183 330/308 |

(Continued)

FOREIGN PATENT DOCUMENTS

WO    2020/219534 A1    10/2020

OTHER PUBLICATIONS

International Search Report and Written Opinion from Application No. PCT/US2022/012068 dated Mar. 17, 2022.

*Primary Examiner* — Henry Choe
(74) *Attorney, Agent, or Firm* — Troutman Pepper Hamilton Sanders LLP; Ryan A. Schneider; Mark Lehl Jones (57) ABSTRACT

A dual-drive power amplifier (PA) where the PA core includes a differential pair of transistors M1 and M2 that are driven by a coupling network having two transmission-line couplers, where a first transmission line section of a coupler is configured to transmit an input signal Vin through to drive a gate of the opposite transistor, while the second transmission line section is grounded at one end and coupled with the first transmission line section such that a coupled portion αVin of the input signal Vin drives the source terminal of a corresponding transistor. The arrangement of the coupling network allows the source terminals to be driven below ground potential. Embodiments disclosed here further provide an input matching network, a driver, an inter-stage matching network, and an output network for practical implementation of the PA core.

23 Claims, 4 Drawing Sheets

Related U.S. Application Data

(60) Provisional application No. 63/136,264, filed on Jan. 12, 2021.

(51) Int. Cl.
| | | |
|---|---|---|
| *H03F 1/56* | (2006.01) | |
| *H03F 1/32* | (2006.01) | |
| *H03F 1/02* | (2006.01) | |

(52) U.S. Cl.
CPC .. *H03F 2200/222* (2013.01); *H03F 2200/387* (2013.01)

(58) Field of Classification Search
USPC .......................................... 330/252, 253, 69
See application file for complete search history.

(56) References Cited

U.S. PATENT DOCUMENTS

| | | | |
|---|---|---|---|
| 2012/0038421 A1* | 2/2012 | Bouisse | H01L 24/49 330/253 |
| 2013/0207643 A1* | 8/2013 | Peschke | G01R 1/06766 324/130 |
| 2016/0379744 A1 | 12/2016 | Vaesen | |
| 2018/0006352 A1 | 1/2018 | Issakov et al. | |
| 2018/0332545 A1 | 11/2018 | Sanduleanu et al. | |
| 2019/0372533 A1 | 12/2019 | Huang et al. | |

\* cited by examiner

HIGHLY EFFICIENT DUAL-DRIVE POWER AMPLIFIER FOR HIGH RELIABILITY APPLICATIONS

CROSS-REFERENCE TO RELATED APPLICATIONS

This application is a continuation application under 35 USC § 111(a) claiming the benefit of International Application No. PCT/US22/12068, filed on 12 Jan. 2022, which claims the benefit of U.S. Provisional Application Ser. No. 63/136,264, filed on 12 Jan. 2021, the contents of which are incorporated herein by reference in their entirety as if fully set forth below.

STATEMENT REGARDING FEDERALLY SPONSORED RESEARCH OR DEVELOPMENT

This invention was made with government support under Grant No. FA8650-19-2-9300 awarded by the Air Force Research Laboratory. The government has certain rights in the invention.

THE NAMES OF THE PARTIES TO A JOINT RESEARCH AGREEMENT

Not Applicable

SEQUENCE LISTING

Not Applicable

STATEMENT REGARDING PRIOR DISCLOSURES BY THE INVENTOR OR A JOINT INVENTOR

Not Applicable

BACKGROUND OF THE DISCLOSURE

1. Field of the Disclosure

The various embodiments of the present disclosure relate generally to amplifiers, and more particularly to dual-drive power amplifier configurations for wireless communication applications.

2. Background

Traditional power amplifiers (PA) implemented in CMOS can suffer from low efficiency, low output power, low gain, and limited maximum operating frequency due to factors such as low breakdown voltages, poor quality factor of on-chip passives, and intrinsic device large-signal losses at higher frequencies. Complex design techniques have been implemented to address some of these issues. Techniques such as load modulation, harmonically tuned loads, stacked PA cores, nonlinearity cancellation, neutralization techniques using passive networks, and mixed-signal reconfigurable architectures, for example, have been utilized to improve certain performance metrics of PAs, however the core unit is still based mainly on a common-source/common-emitter (CS/CE) topology. Transistors in most commercial semiconductor processes have a minimum of 3 terminals (gate, source, and drain), but traditional PA design techniques have only exploited the transistor as a 2-terminal device.

New spectrum availability is providing many new 5G New Radio (NR) application opportunities for transmitter systems that operate at high-Gb/s data-rates. However, stringent efficiency and linearity requirements impose significant challenges for designers. Traditional PA designs and the above-mentioned design techniques have focused primarily on increasing the peak/power-back-off (PBO), power added efficiency (PAE) and output power (Pout). However, in highly scaled silicon processes with low supply voltages, such techniques see diminishing returns on PAE and output power since the transistor knee voltage (Vknee) becomes a significant portion of the supply voltage. Moreover, a reduction in supply voltage is often used in practical deployment to ensure device reliability. This is especially relevant for array operations, where array element couplings result in substantial antenna impedance mismatches and undesired large PA voltage swings. Although the previous techniques have improved overall PA efficiency, fundamentally they are incapable of surpassing the theoretical PA core efficiency at the same conduction angle (e.g., Class-B common-source (CS) PA) without resorting to device switching, or harmonic shaping. Performance challenges still exist in terms of improvements in efficiency, output power, linearity, data rate, and reliability of PAs.

BRIEF SUMMARY OF THE DISCLOSURE

The disclosed technology relates to a new power amplifier (PA) topology that employs a new dual-drive PA configuration where the transistors in the PA core are driven out-of-phase at the gate and source terminals using a dual-drive coupling network a while providing the correct DC bias for the gate and source terminals.

According to an exemplary implementation of the disclosed technology, the PA core includes a differential pair of transistors M1 and M2 driven by a coupling network having two transmission-line based couplers, where a first transmission line section of a pair is configured to transmit an input signal Vin through to drive a gate of the opposite transistor, while the second transmission line section is grounded at one end and coupled with the first transmission line section such that a coupled portion αVin of the input signal Vin drives the source terminal of a corresponding transistor. The arrangement of the coupling network allows the source terminals to be driven below ground potential. Embodiments disclosed here further provide an input matching network, a driver, an inter-stage matching network, and an output network for practical implementation of the PA core.

In accordance with an exemplary implementation of the disclosed technology, a dual-drive power amplifier core is provided that includes a first transistor M1 having at least three terminals comprising an M1 gate/base terminal, an M1 drain/collector terminal, and an M1 source/emitter terminal. The dual-drive power amplifier core also includes a second transistor M2 having at least three terminals comprising an M2 gate/base terminal, an M2 drain/collector terminal, and an M2 source/emitter terminal. The dual-drive power amplifier core also includes a first transmission line coupler comprising a first transmission line section T1 having a first end and a second end, wherein the first end is grounded, and the second end is connected to the M1 source/emitter terminal, a second transmission line section T2 having a first end and a second end, wherein the first end is configured to receive a core first input signal Vin+ and a first bias voltage, and wherein the second end is connected to the M2 gate/base terminal and coupled to the M1 drain/collector terminal, and wherein the first transmission line section T1 is electromagnetically coupled with the second transmission line section T2. The dual-drive power amplifier core also includes a second transmission line coupler comprising: a third transmission line section T3 having a first end and a second end, wherein the first end is grounded, and the second end is connected to the M2 source/emitter terminal, a fourth transmission line section T4 having a first end and a second end, wherein the first end is configured to receive a core second input signal Vin− and the first bias voltage, and wherein the second end is connected to the M1 gate/base terminal and coupled to the M2 drain/collector terminal, and wherein the third transmission line section T3 is electromagnetically coupled with the fourth transmission line section T4. The dual-drive power amplifier core also includes a core first output terminal Vout+ connected to the M1 drain/collector terminal and configured to receive a second bias voltage, and a core second output terminal Vout− connected to the M2 drain/collector terminal and configured to receive the second bias voltage, wherein the core first and second output terminals are configured to output an amplified differential signal corresponding to a difference between the core first input signal Vin+ and the core second input signal Vin−.

In accordance with another exemplary implementation of the disclosed technology, a pair of transmission line based coupler is provided. The transmission line based coupler is configured to receive a differential input voltage signal on two input terminals and passively couple a scaled version of the differential input voltage signal on 4 output terminals. The pair of transmission line based couplers includes a first transmission line coupler comprising: a first transmission line section T1 having a first end and a second end, wherein the first end is grounded, and the second end is configured to output a $V_{S1}$ signal, and a second transmission line section T2 having a first end and a second end, wherein the first end is configured to receive a core first input signal Vin+ and a first bias voltage, and wherein the second end is configured to output a $V_{G2}$ signal, and wherein the first transmission line section T1 is electromagnetically coupled with the second transmission line section T2 to produce the $V_{S1}$ signal responsive receiving the input signal Vin+ at the first end of the second transmission line section T2. The pair of transmission line based couplers includes a second transmission line coupler comprising: a third transmission line section T3 having a first end and a second end, wherein the first end is grounded, and the second end is configured to output a $V_{S2}$ signal, and a fourth transmission line section T4 having a first end and a second end, wherein the first end is configured to receive a core second input signal Vin− and the first bias voltage, and wherein the second end is configured to output a $V_{G1}$ signal, and wherein the third transmission line section T3 is electromagnetically coupled with the fourth transmission line section T4 to produce the $V_{G1}$ signal responsive receiving the input signal Vin− at the first end of the fourth transmission line section T4.

In accordance with another exemplary implementation of the disclosed technology, a power amplifier core comprises a transistor differential pair, each transistor having a gate terminal, a drain terminal, and a source terminal, and a multi-feed coupling network configured to drive the core out-of-phase at the gate and source terminals by allowing the transistor differential pair to be driven out-of-phase at the gate and source terminals, and allow the source and drain terminals to swing in-phase.

The multi-feed coupling network can couple the input signal from the gate terminal of a first transistor of the transistor differential pair to the source terminal of a second transistor of the transistor differential pair, and the gate terminal of the second transistor to the source terminal of the first transistor, while providing a non-zero DC voltage for the gate terminal and a DC ground for the source terminal.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein.

Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

DETAILED DESCRIPTION

Although preferred exemplary embodiments of the disclosure are explained in detail, it is to be understood that other exemplary embodiments are contemplated. Accordingly, it is not intended that the disclosure is limited in its scope to the details of construction and arrangement of components set forth in the following description or illustrated in the drawings. The disclosure is capable of other exemplary embodiments and of being practiced or carried out in various ways. Also, in describing the preferred exemplary embodiments, specific terminology will be resorted to for the sake of clarity.

As used in the specification and the appended claims, the singular forms "a," "an" and "the" include plural referents unless the context clearly dictates otherwise.

Also, in describing the preferred exemplary embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" one particular value and/or to "about" or "approximately" another particular value. When such a range is expressed, another exemplary embodiment includes from the one particular value and/or to the other particular value.

Using "comprising" or "including" or like terms means that at least the named compound, element, particle, or method step is present in the composition or article or method, but does not exclude the presence of other compounds, materials, particles, method steps, even if the other such compounds, material, particles, method steps have the same function as what is named.

Mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Thus, to facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

The disclosed technology includes a new power amplifier (PA) architecture that may overcome some of the above-mentioned challenges associated with conventional approaches. The disclosed PA topology employs a new dual-drive configuration where the PA core transistors are driven out-of-phase at the gate and source terminals. The term "transistor" as used herein may refer to any 3-terminal signal amplifying device, including but not limited MOSFET, CMOS, NMOS, PMOS, BJT, NPN, PNP, etc. (with corresponding terminals, such as base, collector, and emitter for a BJT, for example).

The disclosed PA topology allows for the source and drain of the transistor to swing in-phase, thus artificially decreasing the knee voltage of the transistor, which allows for an increase in the output voltage swing. This dual-drive PA topology greatly increases the output power, linearity, and efficiency of the PA while allowing a reduction in the supply voltage. Furthermore, since the disclosed dual-drive topology may be configured as a combination between common-gate and common-source, the input impedance of the PA stage can be greatly reduced, allowing for broadband and a low-loss inter-stage matching network. The PA topology disclosed herein can provide superior performance for high reliability commercial applications, while enabling the use of a lower supply voltage.

Figure 1A:
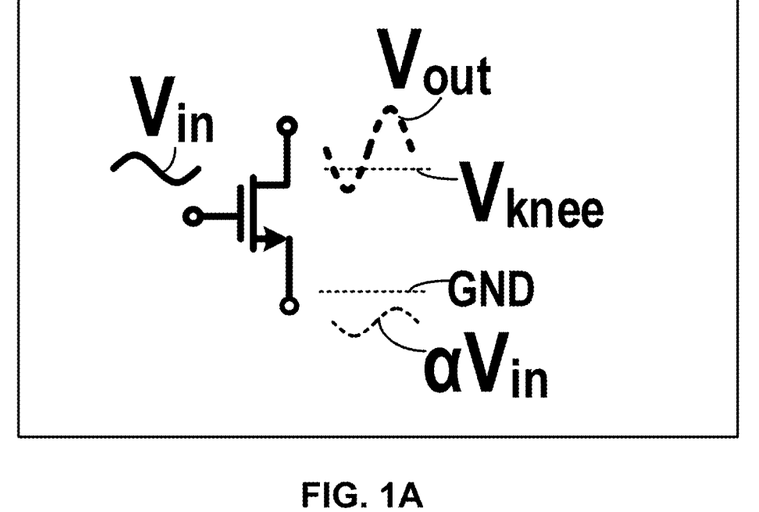
FIG. 1A is an example illustration of a MOSFET transistor having a gate terminal driven by a first drive signal Vin, a source terminal driven by a second drive signal αVin, and a resulting output signal Vout, in accordance with an exemplary embodiment of the disclosed technology.

FIG. 1A is an example illustration of a dual-drive MOSFET transistor having a gate terminal driven by a first drive signal Vin, a source terminal driven by a second drive signal αVin, and a resulting output signal Vout, in accordance with an exemplary embodiment of the disclosed technology. In this implementation, a may be negative to provide a source drive signal that is out-of-phase with the gate drive signal Vin.

Figure 1B:
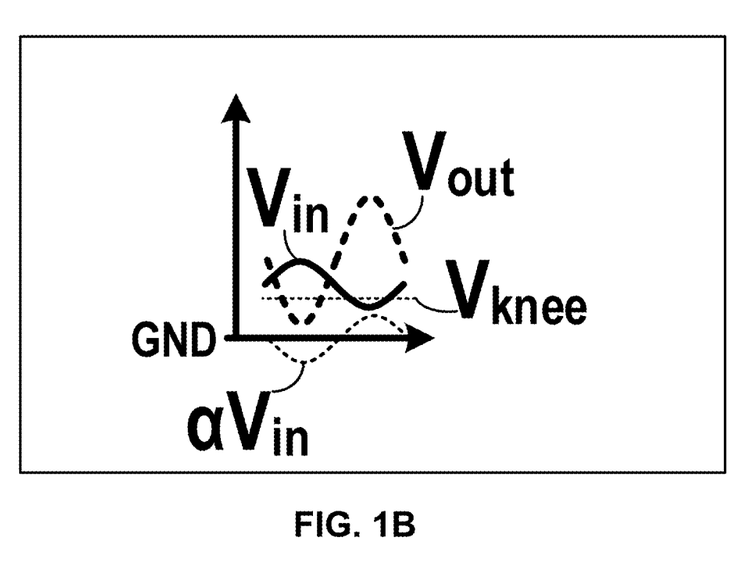
FIG. 1B is graph the first drive signal Vin, the second drive signal αVin, and a resulting output signal Vout (as shown in FIG. 1A) relative to ground and a knee voltage Vknee, in accordance with an exemplary embodiment of the disclosed technology.

FIG. 1B is graph the first drive signal Vin, the second drive signal αVin, and a resulting output signal Vout (as shown in FIG. 1A) relative to ground and a knee voltage, in accordance with an exemplary embodiment of the disclosed technology.

The power efficiency of a dual-drive transistor may be expressed as:

$$\eta_{Dual\ Feed} = \frac{(V_{DD} + \alpha V_{in} - V_{knee}) \times I_{max}}{2 \times V_{DD} \times I_{DC}}, \quad (1)$$

where $V_{DD}$ is a supply voltage, $V_{knee}$ is a knee voltage of the transistor, $I_{max}$ is a maximum current through the transistor, and $I_{DC}$ is bias current. The peak output voltage may be expressed as:

$$V_{peak} = V_{DD} + \alpha V_{in} - V_{knee}. \quad (2)$$

The bias current may be expressed as:

$$I_{DC} = \frac{2 \times I_{max}}{\pi}. \quad (3)$$

The power efficiency of the dual-feed transistor relative to a typical class B amplifier may be expressed as:

$$\eta_{Dual\ Feed} = \eta_{Class\ B}\left[1 + \frac{\alpha V_{in}}{V_{DD} - V_{knee}}\right], \quad (4)$$

where the efficiency of a typical class B device may be expressed as:

$$\eta_{Class\ B} = \frac{\pi}{4}\left[1 - \frac{V_{knee}}{V_{DD}}\right]. \quad (5)$$

As discussions herein, the transistor may be biased as class B. However, in accordance with certain exemplary implementations of the disclosed technology, a bias voltage at the gate of the transistor may be adjusted to place the device in any of class A, class B, or class C amplification as needed for the particular application.

When a transistor is only driven at the gate, the device maximum efficiency is dictated by the device conduction angle and the technology-specific Vknee, which reduces the peak output voltage swing and restricts the drain efficiency, particularly for lower VDD values. The disclosed technology exploits the transistor being a three or more-terminal device and further provides a coupling network to drive both the gate and the source terminals with out-of-phase inputs Vin and αVin respectively. The source voltage may swing below ground while having an in-phase relationship with the drain voltage, increasing the maximum drain output voltage swing by αVin without having to increase the supply voltage.

Benefits of the dual-drive PA topology disclosed herein may include: (1) an increase in the PA core drain efficiency beyond that of the typical common source topology at the same conduction angle via an increase in the source coupling coefficient; (2) higher drain efficiency that can be maintained even at reduced VDD voltages since the effect of Vknee under a lower VDD can be mitigated; (3) the power saturation Psat can be increased while reducing the device AM-PM and AM-AM distortion since the active device spends more time in its saturation region and less in triode; (4) the parallel input resistance of the transistor is reduced since the device gate impedance is combined in parallel with its low source impedance, which also can be engineered by the source coupling αVin to ease the design of broadband and low loss inter-stage matching networks; and (5) reliability issues of voltage peaking in complex harmonic-shaping PAs may be mitigated (Class-J or continuous-mode Class-F PAs).

The dual-drive PA topology disclosed herein is particularly suitable for high-reliability commercial/defense applications that mandate lower supply voltages. Certain exemplary implementations of the disclosed technology may also be suitable for power amplifiers having high supply voltages, such as in satellite communication applications where the supply voltages can be 20 volts and higher. It should also be emphasized that the dual-drive PA topology disclosed herein is different from traditional stacked PAs. In such traditional stacked PA devices, the MOSFET transistor source terminal of the bottom stacked device is tied to ground, which critically determines the total device output voltage swing. On the contrary, the source terminals of the disclosed technology are connected to a coupled transmission line that enables the source voltage to drop below ground, as will be discussed below.

Figure 2:
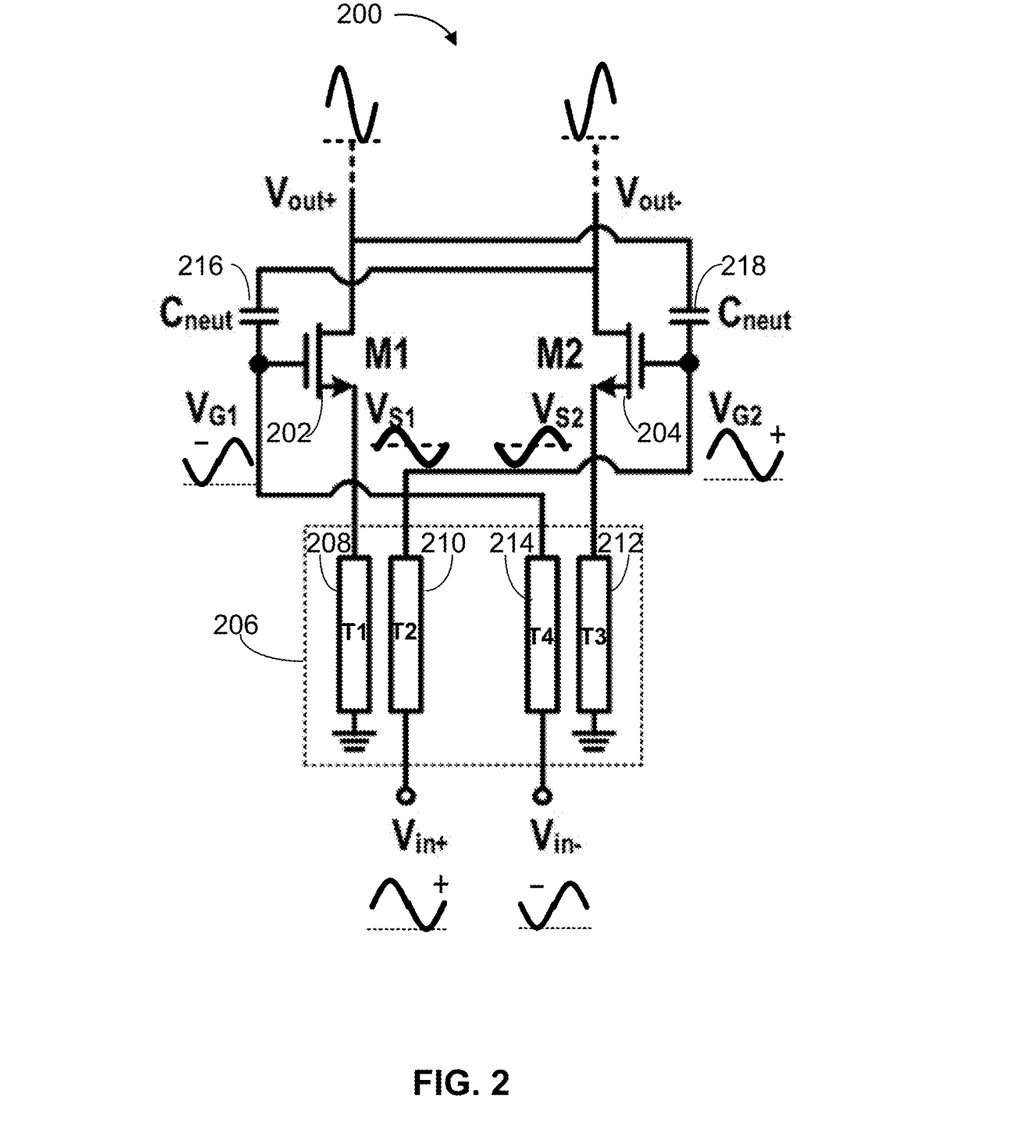
FIG. 2 is a schematic diagram of a dual-drive power amplifier (PA) core, in accordance with an exemplary embodiment of the disclosed technology.

FIG. 2 is a schematic diagram of a dual-drive power amplifier (PA) core, in accordance with an exemplary embodiment of the disclosed technology, which may utilize a transistor differential pair including a first transistor M1 202 and a second transistor M2 204 with a dual-drive coupling network 206. The dual-drive coupling network 206 may include transmission line segments T1 208, T2 210, T3 212, and T4 214, where T1 208 and T2 210 are electromagnetically coupled, and T4 214, where T1 208 are electromagnetically coupled. The dual-drive coupling network 206 enables a first portion Vin− of balanced input signal to be applied through T4 214 to drive the gate of M1 202, while coupling a version of Vin− via T3 212 to drive the source terminal of M2 204. Simultaneously, a second portion Vin+ of the balance input signal Vin+ may be applied through T2 210 to drive the gate of M2 204, while coupling a version of Vin+ via T1 208 to drive the source terminal of M1 202. Implementations disclosed herein further allow for providing a correct DC bias point, such as non-zero DC voltage for the gates and a DC ground for the sources. Using this new PA topology, the sources of the transistors 202 204 may swing in-phase with their drains, thus allowing the extension of the voltage knee/output swing which can linearly increase output power, and power added efficiency while using a low supply voltage.

Figure 3A:
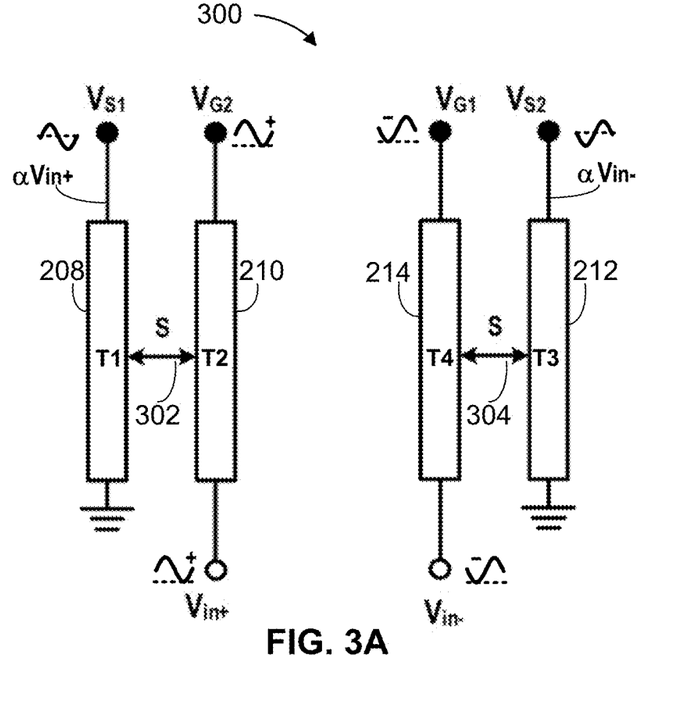
FIG. 3A is an illustration of coupled transmission line pairs that enable passive generation of a signals αVin+ from Vin+ and αVin− from Vin−, in accordance with an exemplary embodiment of the disclosed technology.

FIG. 3A is an illustration of a coupling network 300 that includes the pair of transmission line based couplers T1 208 and T2 210, T3 212 and T4 214 as illustrated in FIG. 2, where T1 208 is coupled (S 302) with T2 210 and T3 212 is coupled (S 304) with T4 214. While each of T1 208, T2 210, T3 212, and T4 214 (in isolation) could be considered independent transmission lines, the proximity of T1 208 to T2 210 allows electromagnetic coupling therebetween such that T1 208 and T2 210 may form a first transmission line-based coupler. Similarly, T3 212 and T4 214 may form a second transmission line-based coupler. The coupling 302 304 enables passive generation of signals αVin+ and αVin− respectively from Vin+ and Vin−. In certain exemplary implementations, the coupling network 300 can introduce inductive reactance source degeneration that can lower the overall device power gain. In certain implementations, the inductive reactance can be reduced by choosing the transmission line geometries that provide reasonably low values for the even mode impedance $Z_{Oe}$ and the odd mode impedance $Z_{Oo}$ while maintaining the desired coupling coefficient α. According to certain implementation of the disclosed technology, the coupling coefficient α may be set by the transmission line geometries.

In one exemplary implementation of the disclosed technology, the coupling coefficient α may be set in a range between about 0.1 and about 0.9. In another exemplary implementation, the coupling coefficient α may be set in a range between about 0.2 and about 0.8. In another exemplary implementation, the coupling coefficient α may be set in a range between about 0.3 and about 0.7. In another exemplary implementation, the coupling coefficient α may be set in a range between about 0.4 and about 0.6. In another exemplary implementation, the coupling coefficient α may be set in a range between about 0.3 and about 0.4.

Figure 3B:
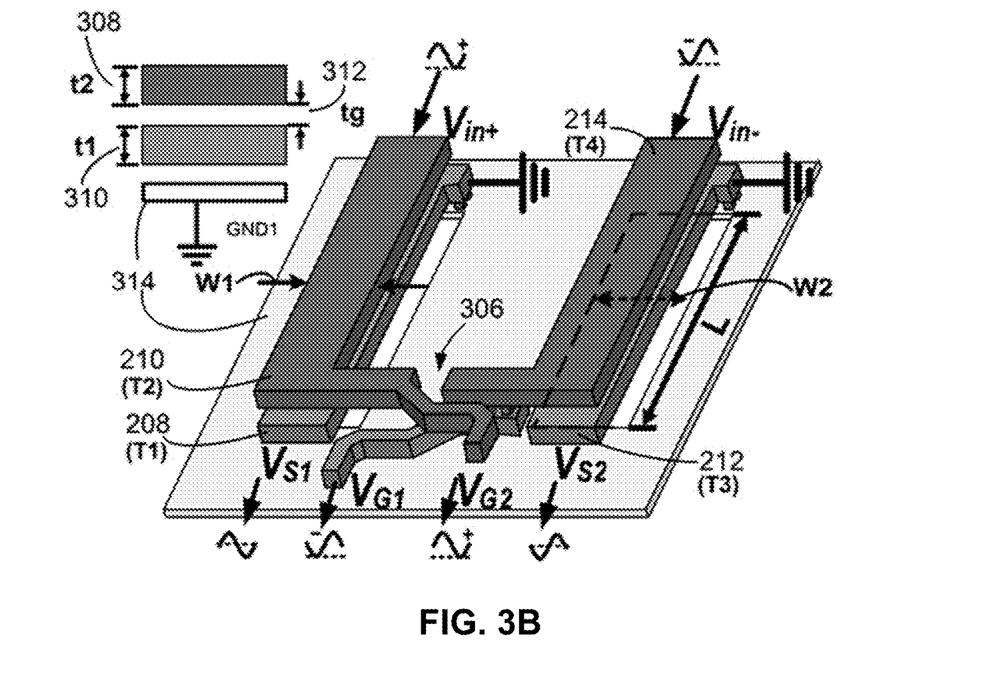
FIG. 3B is a three-dimensional illustration of an example physical layout of the coupled transmission line pairs as illustrated in FIG. 3A, in accordance with an exemplary embodiment of the disclosed technology.

FIG. 3B is a three-dimensional illustration of an example physical layout of the coupling network 300 having coupled transmission line pairs T1 208 and T2 210, T3 212 and T4 214 corresponding to like elements as depicted in FIG. 3A and FIG. 2. This unique layout arrangement enables a signal Vin+ (Vin−) to be input at one end of a transmission line T2 210 (T4 214) to be electromagnetically coupled over its length L to T1 208 (T3 212). In accordance with certain exemplary implementations of the disclosed technology, a unique crossover region 306 may be used to conveniently route the resulting signals $V_{S1}$, $V_{G1}$, $V_{G2}$, $V_{S2}$ to the remaining circuit (as will be discussed further below).

In certain exemplary implementations, the transmission lines 208, 210, 212, 214 of the coupling network 300 may be designed and manufactured using several different variables to control impedance, coupling coefficients, etc. Such variables can include transmission line lengths L, widths W1, thicknesses t2, t1, gaps tg, and/or ground plane aperture widths W2. In one exemplary implementation of the disclosed technology, the lengths L can be about 50 microns, the widths W1 can be about 10 microns, the thicknesses t1 and t2 can be about 3 microns, the gaps tg can be about 1.6 microns, and the ground plane aperture widths W2 can be about 14 microns. As illustrated, one end of the bottom traces T1 208 and T3 212 may be connected to a ground plane 314. With these geometries, the even mode impedance $Z_{Oe}$ and odd mode impedance $Z_{Oo}$ may be set respectively to about 15 ohms about 40 ohms at 30 GHz. In certain exemplary implementations, the conduction angle may be adjusted to about 8.5 degrees, and the k-factor may be about 0.47 at 30 GHz.

Figure 4A:
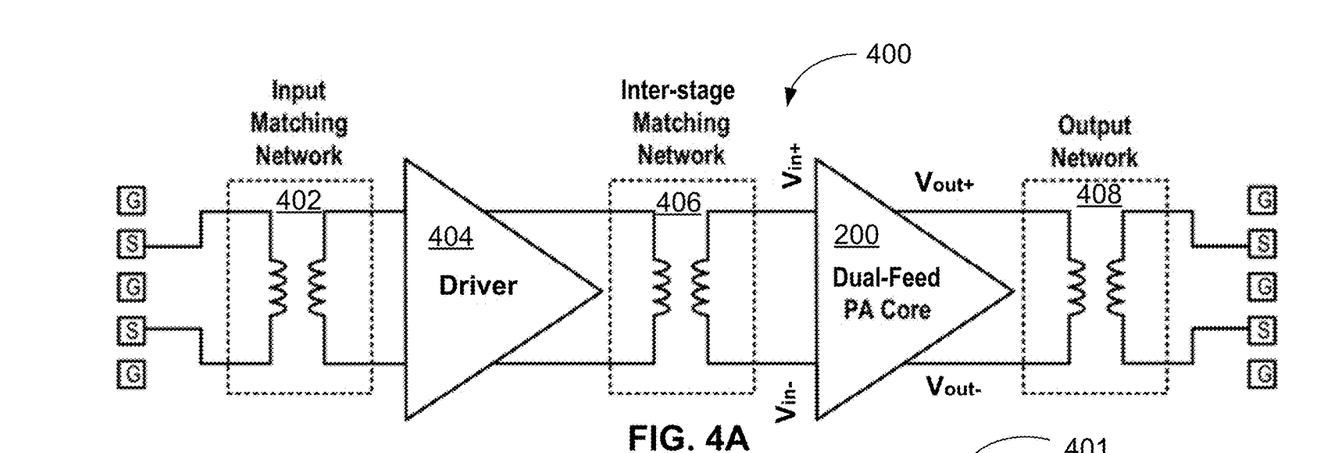
FIG. 4A is an example block diagram of a power amplifier that utilizes a dual-drive core, in accordance with an exemplary embodiment of the disclosed technology.

FIG. 4A is a block diagram of an example power amplifier 400 that can utilize the dual-drive PA core 200 (as discussed above) in accordance with an exemplary embodiment of the disclosed technology. Various arrangement may be configured to utilize the dual-drive core 200 without departing from the scope of the disclosed technology. FIG. 4A depicts one practical example of how other stages (such as an input matching network 402, a driver 404, an inter-stage matching network 406 and/or an output network 408) may be utilized with the dual-drive PA core 200. Certain example components of the stages of the example power amplifier 400 will now be discussed with reference to FIG. 4B.

Figure 4B:
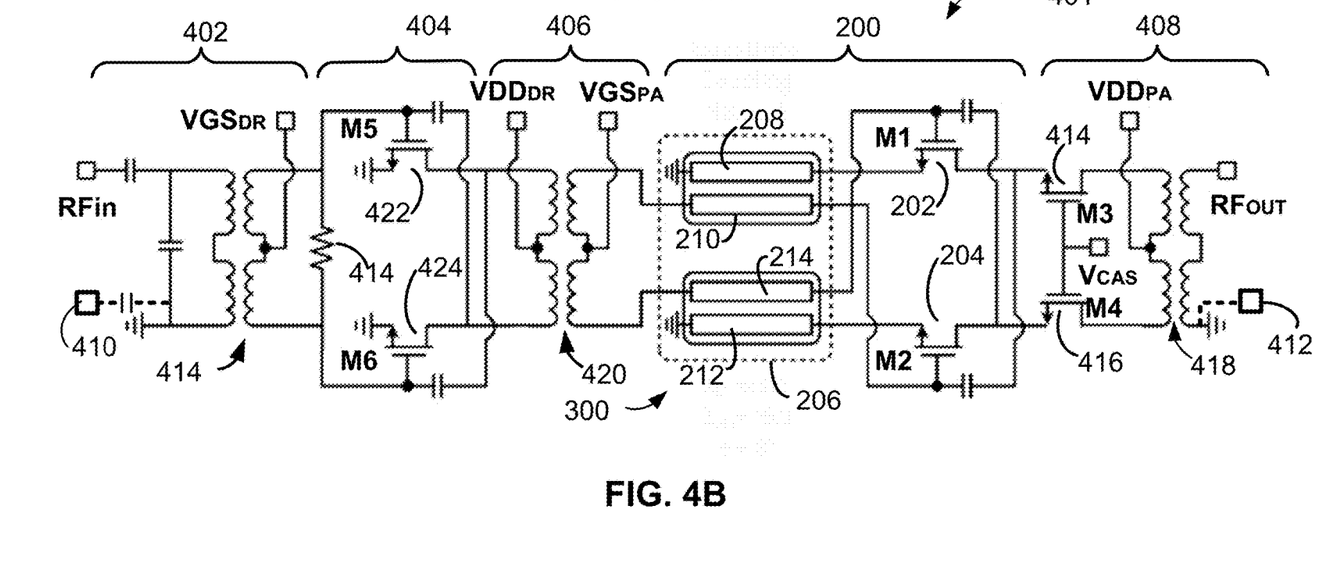
FIG. 4B is a detailed schematic diagram of a power amplifier that utilizes a dual-drive core (corresponding to the block diagram of FIG. 4A), in accordance with an exemplary embodiment of the disclosed technology.

FIG. 4B is a detailed schematic diagram of an example power amplifier circuit 401 that utilizes a dual-drive PA core 200 in accordance with an exemplary embodiment of the disclosed technology. While other stages, components, and arrangements may be utilized without departing from the scope of the disclosed technology, the arrangement shown in FIG. 4B depicts a practical use of the dual-drive PA core 200, with stages 402, 404, 406, 408 that may correspond with like stages shown in FIG. 4A.

As discussed above with reference to FIGS. 2, 3A, and 3B, the dual-drive power amplifier core 200 can include a first transistor M1 202 having at least three terminals comprising an M1 gate terminal, an M1 drain terminal, and an M1 source terminal. The dual-drive power amplifier core 200 can include a second transistor M2 204 having at least three terminals comprising an M2 gate terminal, an M2 drain terminal, and an M2 source terminal.

The dual-drive power amplifier core 200 can include a first transmission line coupler comprising a first transmission line section T1 208 having a first end and a second end, wherein the first end is grounded, and the second end is connected to the M1 source terminal.

The dual-drive power amplifier core 200 can include a first transmission line coupler comprising a second transmission line section T2 210 having a first end and a second end, wherein the first end may be configured to receive one or more of a core first input signal and/or a first bias voltage. The second end of the second transmission line section T2 210 may be connected to the M2 gate terminal and may be capacitively coupled to the M1 drain terminal. As discussed above, the first transmission line section T1 208 may be electromagnetically coupled with the second transmission line section T2 210.

The dual-drive power amplifier core 200 can include a second transmission line coupler comprising a third transmission line section T3 212 having a first end and a second end, wherein the first end is grounded, and the second end may be connected to the M2 source terminal.

The dual-drive power amplifier core 200 can include a fourth transmission line section T4 214 having a first end and a second end, wherein the first end may be configured to receive one or more of a core second input signal and/or the first bias voltage. The second end of the fourth transmission line section T4 214 may be connected to the M1 gate terminal and in certain implementations, may be capacitively coupled to the M2 drain terminal. As discussed above, the third transmission line section T3 212 may be electromagnetically coupled with the fourth transmission line section T4 214.

In certain exemplary implementations, and as shown in FIG. 4B, the M1 202 and M2 204 drain terminals may be configured as outputs and may also receive $VDD_{PA}$ via the output network 408. In certain exemplary implementations, the drain terminals of M1 202 and M2 204 may be considered core first and second output terminals respectively and may be configured to output an amplified differential signal corresponding to a difference between the core first input signal and the core second input signal at respective gates of M1 202 and M2 204.

In certain exemplary implementations, the circuit 401 can include a cascode current buffer having a cascode bias control terminal $V_{CAS}$ configured to control the voltage applied to the M1 202 drain terminal and the M2 204 drain terminal. In certain exemplary implementations, the cascode current buffer may allow an increase in the supply voltage and output power. In certain exemplary implementations, the cascode current buffer may be biased for 1.3 V operation. The cascode current buffer can include a third transistor M3 414 having at least three terminals comprising an M3 gate terminal, an M3 drain terminal, and an M3 source terminal. The cascode current buffer can include a fourth transistor M4 416 having at least three terminals comprising an M4 gate terminal, an M4 drain terminal, and an M4 source terminal. In certain exemplary implementations, the M3 source terminal may be connected to the core first output terminal and the M4 source terminal may be connected to the core second output terminal. In certain exemplary implementations, the M3 gate terminal may be connected to the M4 gate terminal and to the cascode bias control terminal $V_{CAS}$.

In certain exemplary implementations, the circuit 401 can include an output network 408 having an output transformer 414 with primary first terminal, and a primary second terminal. In certain exemplary implementations, the output transformer 414 may include a primary center tap terminal. In certain exemplary implementations, the primary first terminal may be connected to the M3 drain terminal, the primary second terminal may be connected to the M4 drain terminal. In certain exemplary implementations, the primary center tap terminal may be configured to receive a supply voltage $VDD_{PA}$. In certain exemplary implementations, the cascode bias control terminal $V_{CAS}$ may be configured to control the second bias voltage applied to the M1 drain terminal and the M2 drain terminal. In certain exemplary implementations, the second bias voltage may be derived from the supply voltage $VDD_{PA}$.

As shown in FIG. 4B, the circuit 401 can include an inter-stage matching network 406 that can include a transformer 420 having a primary first terminal, a primary second terminal, and a primary center tap terminal, a secondary first terminal, a secondary second terminal, and a secondary center tap terminal. In certain exemplary implementations, the secondary first terminal may be connected to the first end of the second transmission line section T2 210, and the secondary second terminal may be connected to the first end of the fourth transmission line section T4 214. In certain exemplary implementations, the secondary center tap terminal may configured to receive a VGSPA bias voltage.

In communication with the inter-stage matching network 406 may be a common source driver 404 that can include a fifth transistor M5 422 having at least three terminals comprising an M5 gate terminal, an M5 drain terminal, and an M5 source terminal.

In certain exemplary implementations, the common source driver 404 can include a sixth transistor M6 424 having at least three terminals comprising an M6 gate terminal, an M6 drain terminal, and an M6 source terminal. In certain exemplary implementations, the common source driver 404 can include a gate resistor 414 having a first end and a second end. In certain exemplary implementations, the M5 source terminal and the M6 source terminal may be connected to ground, the M5 drain terminal may be connected to the primary first terminal of the inter-stage matching network 406 and may be capacitively coupled to the M6 gate terminal. In certain exemplary implementations, the M6 drain terminal may be connected to the primary second terminal of the inter-stage matching network 406 and may be capacitively coupled to the M5 gate terminal. In certain exemplary implementations, the M5 gate terminal may be connected to the first end of the gate resistor 414, and the M6 gate terminal may be connected to the second end of the gate resistor 414. In certain exemplary implementations, the gate resistor 414 may be selected to optimize the input impedance of the driver stage 404, for example to minimize S11 (input reflection) parameters.

Certain exemplary implementations of the disclosed technology can include VDDDR terminal connected to the primary center tap terminal of the inter-stage matching network transformer 420 and may be configured to receive a supply voltage for the common source driver 404 circuit.

In certain exemplary implementations, the input side of the power amplifier circuit 401 (shown on the left side of FIG. 4B) can include an input matching network 402 that can include an input transformer 414 having a primary first terminal, a primary second terminal, a secondary first terminal, and a secondary second terminal. In one exemplary implementation of the disclosed technology, one or more of the RF input terminals may be capacitively coupled with the primary terminals of the input transformer 414. In certain exemplary implementations, the transformer 414 can include a secondary center tap terminal that can be connected to a $VGS_{DR}$ bias input terminal for biasing the gate-source of M5 422 and M6 242 in the driver section 404. In certain exemplary implementations, the secondary first terminal of the transformer 414 may be connected to the first end of a gate resistor 414, and the secondary second terminal may be connected to the second end of the gate resistor 414. In one exemplary implementations, the gate resistor 414 may be about 550 ohms. Other values for the gate resistor 414 may be utilized as needed.

In certain exemplary implementations, the input matching network 402 may be configured as a single-ended RF input (referenced to ground) as shown. Alternatively, the input ground connection may be opened and the second primary input of the input transformer 414 may be connected with another RF input connection 410 for accepting a balanced input (or an input signal not referenced to ground). Similarly, on the output side (far right side), the output network 408 can be configured a single-ended RF output referenced to ground (as shown), or alternatively, the output ground connection may be opened, and the corresponding output transformer terminal may be connected with a second RF output connection 412, for example, to provide an output that is balanced, floating, and/or otherwise not referenced to ground.

Compared to conventional capacitive coupling networks, the coupled transmission lines (T1 208 coupled with T2 210, and T3 212 coupled with T4 214) may be configured to account for all routing parasitics and can be optimized for the desired amplitude/phase coupling with flexibility. Moreover, this input coupling network 206 naturally offers an appropriate DC biasing for each transistor M1 202 and M2 204 device terminals without requiring additional passives (assuming the interstage matching transformer 420 provides the DC gate biasing through its center-tap).

In accordance with certain exemplary implementations of the disclosed technology, neutralization capacitors may be used in one or more of the driver 404 and/or the dual-drive PA core 200 stages to enhance stability and gain. In certain exemplary implementations, the input matching network 402 may include additional capacitors and gate resistive termination for broadband S11 matching. In accordance with certain exemplary implementations of the disclosed technology, the inter-stage matching network 406 may use one transformer 420 without gate de-Qing resistors due to the lower real impedance at the dual-drive PA core input (748Ω for CS and 36Ω for dual-drive PAs).

Based on large-signal CW simulations, the drain efficiency, OP1 dB, and Psat of the dual-drive PA core may increase as the coupling coefficient α increases. Conversely, as a increases the power gain may decrease due to the reduction of the PA core input impedance and the source inductive degeneration. Therefore, an optimum dual-drive operation region may exist where the gain is sufficient to maintain the overall PA PAE. In accordance with certain exemplary implementations of the disclosed technology, a may be chosen to be 0.35.

A prototype of the disclosed dual-drive PA occupying a total area of $1.3 \times 1.2$ mm$^2$ was fabricated using a 45 nm SOI CMOS process. The maximum OP1 dB of 19.1 dBm is achieved at 31 GHz and has less than 1 dB variation from 23 to 34 GHz.

The prototype disclosed dual-drive PA, as disclosed herein, may achieve a maximum PAE (PAEmax) of 50% and maximum DE (DEmax) of 59.7% at 29 GHz, which is the highest reported PAE and DE for a 2-stage PA in silicon. From 24 to 35 GHz the PA also maintains a PAEmax ≥40%. The OP1 dB and Psat are within 1 dB throughout the bandwidth with a maximum PAE at OP1 dB (PAEOP1 db) of 47.4%.

Single-carrier-signal and 5G NR FR2 modulation tests with no DPD from 24 to 36 GHz for a 1.7/1.9V VDD indicate the disclosed technology provided the highest measured performance for average Pout/PAE (Pavg/PAEavg), which is 15.05 dBm/30.13% for 1.5 GSym/s 64-QAM signal with −25 dB rms EVM at 30 GHz for a 1.9V supply. The highest measured performance for Pavg/PAEavg is 11.39 dBm/16.98% for a 5G NR FR2 200 MHz 1-CC 64-QAM signal with −25 dB rms EVM at 30 GHz for a 1.9V supply.

Tables 1A, 1B, and 1C in the APPENDIX summarize the performance results of the dual-drive PA technology disclosed herein with respect to previous work. Certain exemplary implementations of the disclosed technology supports highly efficient and linear broadband modulations, which outperforms previous PAs and underscores the suitability of the disclosed dual-drive PA for high-reliability applications.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

APPENDIX

TABLE 1A

| | This Work | | | | [1] Li ISSCC 18 | | | | | | [2] Ning BCICTS 2018 |
|---|---|---|---|---|---|---|---|---|---|---|---|
| Technology | 45 nm SOI CMOS | | | | 0.13 µm SiGe | | | | | | 45 nm SOI CMOS |
| Architecture | Dual-Drive PA Core | | | | Differential 2-Stage Continuous-mode Harmonically-tuned | | | | | | Class AB |
| Supply (V) | 1.7 | | 1.9 | | 1.9 | | | | | | 2.4 |
| Gain (dB) | 20 | | 20.4 | | 20 | | | | | | 13.6 |
| $OP_{1\,dB}\,BW_{-1\,dB}$ | 23 to 34 (39%) | | 23.5 to 34 (37%) | | 43.30% | | | | | | N/A |
| Freq (GHz) | 28 | 30 | 28 | 30 | 28.5 | | | | | | 28 |
| Psat (dBm) | 19.3 | 19.1 | 20.1 | 20.1 | 17 | | | | | | 18 |
| $OP_{1\,dB}$ (dBm) | 17.9 | 18.0 | 19.1 | 19.0 | 15.2 | | | | | | 16* |
| $DE_{max}$ (%) | 58.7 | 59.1 | 57.4 | 59.3 | 50 | | | | | | N/A |
| $PAE_{max}$ (%) | 47.3 | 48.3 | 48.3 | 49.7 | 43.5 | | | | | | 48.2 |
| $PAE_{OP1\,dB}$ (%) | 43.0 | 44.8 | 45.5 | 47.1 | 39.2 | | | | | | 32.5* |
| Modulation Scheme | 64-QAM (1.9 V) | | 5G NR FR2 (1.9 V) | | 64-QAM | | | | 256-QAM | | 64-QAM |
| Freq (GHz) | 28 | 30 | 28 | 30 | 28.5 | | | | | | 30 |
| Data Rate (Gb/s) | 9 | 9 | 200 MHz | 200 MHz | 6 | 9 | 18 | 4 | 6.4 | 8 | 0.1 MSym/s |
| EVM (dB) | −25.0 | −25.1 | −25.0 | −25.0 | −27.6 | −26.8 | −25.0 | −31.3 | −30.5 | −30.5 | −27.5 |
| ACPR (dB) | −29.7 | −28.8 | −26.6 | −26.5 | N/A | N/A | N/A | N/A | N/A | N/A | −30 |
| $P_{avg}$ | 14.1 | 15.1 | 10.7 | 11.4 | 10.7 | 10.7 | 9.8 | 8.8 | 8.8 | 8.7 | 8.4 |
| $PAE_{avg}$ | 25.1 | 30.1 | 15.5 | 17.0 | 21.4 | 21.5 | 18.4 | 16.2 | 16.7 | 16.3 | N/A |
| Area (mm²) | 0.21 (Core Size) | | | | 0.29 (Core Size) | | | | | | 0.27 |

[1] T. Li et al., "A Continuous-Mode Harmonically Tuned 19-to-29.5 GHz Ultra-Linear PA Supporting 18 Gb/s at 18.4% Modulation PAE and 43.5% Peak PAE," ISSCC, pp. 410-412, February 2018.

[2] K. Ning and J. F. Buckwalter, "A 28-GHz, 18-dBm, 48% PAE Stacked-FET Power Amplifier with Coupled-Inductor Neutralization in 45-nm SOI CMOS," 2018 IEEE BiCMOS and Compound Semiconductor Integrated Circuits and Technology Symposium (BCICTS), 2018, pp. 85-88, doi: 10.1109/BCICTS.2018.8550832.

[3] F. Wang et al., "A Highly Linear Super-Resolution Mixed-Signal Doherty Power Amplifier for High-Efficiency mm-Wave 5G Multi-Gb/s Communications," ISSCC, pp. 88-90, February 2019.

[4] S. Ali et al., "A 28 GHz 41%-PAE Linear CMOS Power Amplifier Using a Transformer-Based AM-PM Distortion-Correction Technique for 5G Phased Arrays," ISSCC, pp. 406-408, February 2018.

[5] M. Vigilante and P. Reynaert, "A Wideband Class-AB Power Amplifier With 29-57-GHz AM-PM Compensation in 0.9-V 28-nm Bulk CMOS," IEEE JSSC, vol. 53, no. 5, pp. 1288-1301, May 2018.

TABLE 1B

| | This Work | | | | [3] Wang ISSCC 19 | | [4] Ah ISSCC 18 | | | [5] Vigilante JSSC 18 | | | |
|---|---|---|---|---|---|---|---|---|---|---|---|---|---|
| Technology | 45 nm SOI CMOS | | | | 45nm SOI CMOS | | 65 nm CMOS | | | 28 nm CMOS | | | |
| Architecture | Dual-Drive PA Core | | | | Mixed-Signal Doherty | | Transformer based AM-PM correction | | | Transformer-based High Order Network | | | |
| Supply (V) | 1.7 | | 1.9 | | 2 | | 1.1 | | | 0.9 | | | |
| Gain (dB) | 20 | | 20.4 | | 19.1 | | 15.8 | | | 20.8 | | | |
| $OP_{1\,dB}\,BW_{-1\,dB}$ | 23 to 34 (39%) | | 23.5 to 34 (37%) | | N/A | | N/A | | | 32.30% | | | |
| Freq (GHz) | 28 | 30 | 28 | 30 | 27 | | 28 | | 30 | 40 | | 50 | |
| Psat (dBm) | 19.3 | 19.1 | 20.1 | 20.1 | 23.3 | | 15.6 | | 16.6 | 15.9 | | 15.1 | |
| $OP_{1\,dB}$ (dBm) | 17.9 | 18.0 | 19.1 | 19.0 | 22.4 | | 14 | | 13.4 | 11.1 | | 10.9 | |
| $DE_{max}$ (%) | 58.7 | 59.1 | 57.4 | 59.3 | N/A | | N/A | | N/A | N/A | | N/A | |
| $PAE_{max}$ (%) | 47.3 | 48.3 | 48.3 | 49.7 | 40.1 | | 41.0 | | 24.2 | 18.4 | | 14.9 | |
| $PAE_{OP1\,dB}$ (%) | 43.0 | 44.8 | 45.5 | 47.1 | 39.4 | | 34.7 | | 12.6 | 7.5 | | 7.0 | |
| Modulation Scheme | 64-QAM (1.9 V) | | 5G NR FR2 (1.9 V) | | 64-QAM | | 64-QAM | 256-QAM | | 64-QAM | | | |
| Freq (GHz) | 28 | 30 | 28 | 30 | 27 | 27 | 28 | 28 | 28 | 32 | | 34 | |
| Data Rate (Gb/s) | 9 | 9 | 200 MHz | 200 MHz | 6 | 15 | 340 Msym/s | 50 Msym/s | 3 | 3 | 1.5 | 3 | 6 |
| EVM (dB) | −25.0 | −25.1 | −25.0 | −25.0 | −25.3 | −24.0 | −26.4 | −31.7 | −25.0 | −25.0 | −25.0 | −25.0 | −25.0 |
| ACPR (dB) | −29.7 | −28.8 | −26.6 | −26.5 | −29.6 | N/A | −30.0 | −28.0 | −37.6 | −34.2 | −32.1 | −30.2 | −36.9 |
| $P_{avg}$ | 14.1 | 15.1 | 10.7 | 11.4 | 15.9 | 15.0 | 9.8 | 9.4 | 6.8 | 8.1 | 10.1 | 8.9 | 5.9 |
| $PAE_{avg}$ | 25.1 | 30.1 | 15.5 | 17.0 | 29.1 | 26.4 | 18.2 | 16.3 | 2.9 | 3.9 | 5.8 | 4.4 | 2.3 |
| Area (mm²) | 0.21 (Core Size) | | | | 2.87 | | 0.24 | | | 0.16 (Core Size) | | | |

TABLE 1C

| | This Work | | | | [6] Shakib ISSCC 2017 | | | | [7] Wang ISSCC 20 | | | |
|---|---|---|---|---|---|---|---|---|---|---|---|---|
| Technology | 45 nm SOI CMOS | | | | 40 nm CMOS | | | | 45 nm SOI CMOS | | | |
| Architecture | Dual-Drive PA Core | | | | Dual-resonance Transformer | | | | Compensated Distributed Balun | | | |
| Supply (V) | 1.7 | | 1.9 | | 1.1 | | | | 2 | | | |
| Gain (dB) | 20 | | 20.4 | | 22.4 | | | | 20.5 | | | |
| $OP_{1\,dB}\ BW_{-1\,dB}$ | 23 to 34 (39%) | | 23.5 to 34 (37%) | | 24% | | | | 51% | | | |
| Freq (GHz) | 28 | 30 | 28 | 30 | 27 | | 24 | | 28 | 37 | 39 | 42 |
| Psat (dBm) | 19.3 | 19.1 | 20.1 | 20.1 | 15.1 | | 20.0 | | 20.4 | 20.0 | 19.1 | 17.9 |
| $OP_{1\,dB}$ (dBm) | 17.9 | 18.0 | 19.1 | 19.0 | 13.7 | | 19.6 | | 19.1 | 18.9 | 18.0 | 15.7 |
| $DE_{max}$ (%) | 58.7 | 59.1 | 57.4 | 59.3 | N/A | | N/A | | N/A | N/A | N/A | N/A |
| $PAE_{max}$ (%) | 47.3 | 48.3 | 48.3 | 49.7 | 33.7 | | 38.9 | | 45.0 | 38.7 | 38.6 | 35.0 |
| $PAE_{OP1\,dB}$ (%) | 43.0 | 44.8 | 45.5 | 47.1 | 31.1 | | 38.9 | | 42.5 | 37.7 | 37.3 | 30.4 |
| Modulation Scheme | 64-QAM (1.9 V) | | 5G NR FR2 (1.9 V) | | 64-QAM 8-CC OFDM | | | | 5G NR FR2 64-QAM 2-CC OFDM | | | |
| Freq (GHz) | 28 | 30 | 28 | 30 | 27 | | 24 | | 28 | 37 | 39 | 42 |
| Data Rate (Gb/s) | 9 | 9 | 200 MHz | 200 MHz | 800 MHz | | 800 MHz | | 800 MHz | 800 MHz | 800 MHz | 800 MHz |
| EVM (dB) | −25.0 | −25.1 | −25.0 | −25.0 | −25.0 | | −25.1 | | −25.1 | −25.1 | −25.1 | −25.1 |
| ACPR (dB) | −29.7 | −28.8 | −26.6 | −26.5 | −29.4 | | −25.2 | | −25.6 | −27.9 | −26.1 | −26.4 |
| $P_{avg}$ | 14.1 | 15.1 | 10.7 | 11.4 | 6.7 | | 10.9 | | 11.3 | 10.2 | 10.2 | 8.4 |
| $PAE_{avg}$ | 25.1 | 30.1 | 15.5 | 17.0 | 11.0 | | 14.2 | | 16.6 | 13.6 | 13.4 | 10.3 |
| Area (mm$^2$) | 0.21 (Core Size) | | | | 0.225 (Core Size) | | | | 1.35 | | | |

[6] S. Shakib, M. Elkholy, J. Dunworth, V. Aparin and K. Entesari, "2.7 A wideband 28 GHz power amplifier supporting 8×100 MHz carrier aggregation for 5G in 40 nm CMOS," 2017 IEEE International Solid-State Circuits Conference (ISSCC), 2017, pp. 44-45, doi: 10.1109/ISSCC.2017.7870252.

[7] F. Wang and H. Wang, "An Instantaneously Broadband Ultra-Compact Highly Linear PA with Compensated Distributed-Balun Output Network Achieving >17.8 dBm P1 dB and >36.6% PAEP1 dB over 24 to 40 GHz and Continuously Supporting 64-/256-QAM 5G NR Signals over 24 to 42 GHz," ISSCC, pp. 372-374, February 2020.

What is claimed is:

1. A dual-drive power amplifier core comprising
a first transistor comprising first transistor M1 having an M1 gate terminal, an M1 drain terminal, and an M1 source terminal;
a core first output terminal Vout+ configured to be connected to the M1 drain terminal of the first transistor;
a second transistor comprising second transistor M2 having an M2 gate terminal, an M2 drain terminal, and an M2 source terminal;
a core second output terminal Vout− configured to be connected to the M2 drain terminal of the second transistor; and
transmission line couplers comprising:
a first transmission line coupler comprising:
a first transmission line section T1 having a grounded first end and a second end connected to the M1 source terminal; and
a second transmission line section T2 having a first end configured to receive a core first input signal Vin+ and a second end connected to the M2 gate terminal and coupled to the M1 drain terminal; and
a second transmission line coupler comprising:
a third transmission line section T3 having a grounded first end and a second end connected to the M2 source terminal; and
a fourth transmission line section T4 having a first end configured to receive a core second input signal Vin− and a second end connected to the M1 gate terminal and coupled to the M2 drain terminal;
wherein the core first and second output terminals are configured to output an amplified differential signal corresponding to a difference between the core first input signal Vin+ and the core second input signal Vin−;
wherein the first transmission line section T1 is electromagnetically coupled with the second transmission line section T2; and
wherein the third transmission line section T3 is electromagnetically coupled with the fourth transmission line section T4.

2. The dual-drive power amplifier core of claim 1 further comprising:
a cascode current buffer comprising:
a cascode bias control terminal configured to control a bias voltage applied to the M1 drain terminal and the M2 drain terminal;
a third transistor M3 having at least three terminals comprising:
an M3 gate terminal;
an M3 drain terminal; and
an M3 source terminal; and
a fourth transistor M4 having at least three terminals comprising:
an M4 gate terminal;
an M4 drain terminal; and
an M4 source terminal;
wherein the M3 source terminal is connected to the core first output terminal Vout+;
wherein the M4 source terminal is connected to the core second output terminal Vout−; and
wherein the M3 gate terminal is connected to the M4 gate terminal and the cascode bias control terminal.

3. The dual-drive power amplifier core of claim 1 further comprising an inter-stage matching network comprising a transformer having a primary first terminal, a primary second terminal, a primary center tap terminal, a secondary first terminal, a secondary second terminal, and a secondary center tap terminal;

wherein the secondary first terminal is connected to the first end of the second transmission line section T2;

wherein the secondary second terminal is connected to the first end of the fourth transmission line section T4; and wherein the secondary center tap terminal is configured to receive a first bias voltage.

4. The dual-drive power amplifier of claim 1 further comprising a signal crossover region configured to cross route the second transmission line section T2 and the fourth transmission line section T4.

5. The dual-drive power amplifier core of claim 1, wherein:

the first end of the second transmission line section T2 is further configured to receive a first bias voltage;

the first end of the fourth transmission line section T4 is further configured to receive the first bias voltage;

the core first output terminal Vout+ connected to the M1 drain terminal is further configured to receive a second bias voltage; and the core second output terminal Vout− connected to the M2 drain terminal is further configured to receive the second bias voltage.

6. The dual-drive power amplifier of claim 1, wherein the second end of the second transmission line section T2 is capacitively coupled to the M1 drain terminal; and wherein the second end of the fourth transmission line section T4 is capacitively coupled to the M2 drain terminal.

7. The dual-drive power amplifier of claim 1, wherein the second transmission line section T2 is stacked on the first transmission line section T1; and wherein the fourth transmission line section T4 is stacked on the third transmission line section T3.

8. The dual-drive power amplifier of claim 1, wherein the first transistor M1 and the second transistor M2 are fabricated using one or more of bulk CMOS, CMOS SOI, GaAs, and GaN processes.

9. The dual-drive power amplifier core of claim 1 further comprising an output transformer having a primary first terminal, a primary second terminal, and a primary center tap terminal;

wherein the primary first terminal is connected to the M3 drain terminal;

wherein the primary second terminal is connected to the M4 drain terminal;

wherein the primary center tap terminal is configured to receive a supply voltage VDD;

wherein the cascode bias control terminal is configured to control the second bias voltage applied to the M1 drain terminal and the M2 drain terminal; and wherein the second bias voltage is derived from the supply voltage VDD.

10. The dual-drive power amplifier core of claim 3 further comprising:

a common source driver, comprising a fifth transistor M5 having at least three terminals comprising:

an M5 gate terminal;

an M5 drain terminal; and an M5 source terminal;

a sixth transistor M6 having at least three terminals comprising:

an M6 gate terminal;

an M6 drain terminal; and an M6 source terminal; and a gate resistor having a first end and a second end;

wherein the M5 source terminal and the M6 source terminal are connected to ground;

wherein the M5 drain terminal is connected to the primary first terminal of the inter-stage matching network and coupled to the M6 gate terminal;

wherein the M6 drain terminal is connected to the primary second terminal of the inter-stage matching network and capacitively coupled to the M5 gate terminal;

wherein the M5 gate terminal is connected to the first end of the gate resistor; and wherein the M6 gate terminal is connected to the second end of the gate resistor.

11. The dual-feed power amplifier of claim 10 further comprising a VDD terminal connected to the primary center tap terminal of the inter-stage matching network and configured to receive a supply voltage for the common source driver.

12. The dual-feed power amplifier of claim 10 further comprising an input balun network comprising a transformer having a primary first terminal, a primary second terminal, a secondary first terminal, a secondary second terminal, and a secondary center tap terminal connected to a third bias input terminal;

wherein the secondary first terminal is connected to the first end of the gate resistor;

wherein the secondary second terminal is connected to the second end of the gate resistor; and wherein the primary first terminal is capacitively coupled to a first RF input terminal configured to receive a first RF input signal.

13. The dual-drive power amplifier of claim 12, wherein the primary second terminal of the input balun network is connected to ground and coupled to the primary first terminal and wherein the first RF input terminal is configured to receive an unbalanced RF input signal.

14. The dual-drive power amplifier of claim 12, wherein the primary second terminal of the input balun network is capacitively coupled to a second RF input terminal and capacitively coupled to the primary first terminal; and wherein the first RF input terminal and the second RF input terminal are configured to receive a balanced RF signal.

15. A power amplifier core comprising:

a transistor differential pair comprising a first transistor and a second transistor, each of the transistors having a gate terminal, a drain terminal, and a source terminal; and a multi-feed coupling network configured to:

drive the core out-of-phase at the gate and source terminals by allowing the transistor differential pair to be driven out-of-phase at the gate and source terminals; and allow the source and drain terminals to swing in-phase;

wherein the multi-feed coupling network couples:

an input signal from the gate terminal of the first transistor to the source terminal of the second transistor; and the gate terminal of the second transistor to the source terminal of the first transistor:
while configured to provide a non-zero DC voltage for each gate terminal and a DC ground for each source terminal.

16. A pair of transmission line-based couplers configured to receive a differential input voltage signal on two input terminals and passively couple a scaled version of the differential input voltage signal on 4 output terminals, the transmission line pair coupler comprising:
a first transmission line coupler comprising:
a first transmission line section T1 having a first end and a second end, wherein the first end is grounded, and the second end is configured to output a $V_{s1}$ signal; and
a second transmission line section T2 having a first end and a second end, wherein the first end is configured to receive a core first input signal Vin+, and wherein the second end is configured to output a $V_{G2}$ signal, and wherein the first transmission line section T1 is electromagnetically coupled with the second transmission line section T2 to produce the $V_{s1}$ signal responsive receiving the input signal Vin+ at the first end of the second transmission line section T2; and
a second transmission line coupler comprising:
a third transmission line section T3 having a first end and a second end, wherein the first end is grounded, and the second end is configured to output a $V_{s2}$ signal; and
a fourth transmission line section T4 having a first end and a second end, wherein the first end is configured to receive a core second input signal Vin−, and wherein the second end is configured to output a $V_{G1}$ signal, and wherein the third transmission line section T3 is electromagnetically coupled with the fourth transmission line section T4 to produce the $V_{G1}$ signal responsive receiving the input signal Vin− at the first end of the fourth transmission line section T4.

17. The pair of transmission line-based couplers of claim 16, wherein:
the first end of the second transmission line section T2 is further configured to receive a first bias voltage; and
the first end of the fourth transmission line section T4 is further configured to receive the first bias voltage.

18. The pair of transmission line-based couplers of claim 16 further comprising a signal crossover region configured to cross route the $V_{G1}$ signal and the $V_{G2}$ signal to pair respectively with the $V_{s1}$ signal the $V_{s2}$ signal.

19. The pair of transmission line-based couplers of claim 16, wherein the second transmission line section T2 is stacked on the first transmission line section T1; and
wherein the fourth transmission line section T4 is stacked on the third transmission line section T3.

20. The pair of transmission line-based couplers of claim 19, wherein the second transmission line section T2 is configured to couple the Vin+ signal to the first transmission line section T1 with a coupling coefficient based on physical parameters including a transmission line length, a transmission line width, and a gap between transmission lines.

21. The pair of transmission line-based couplers of claim 19, wherein the fourth transmission line section T4 is configured to couple the Vin− signal to the third transmission line section T3 with a coupling coefficient based on physical parameters including a transmission line length, a transmission line width, and a gap between transmission lines.

22. The dual-drive power amplifier core of claim 1, wherein the first transistor and second transistor form a transistor differential pair; and
wherein the transistor differential pair are configured to be driven out-of-phase at the gate and source terminals.

23. The dual-drive power amplifier core of claim 22, wherein the first transmission line coupler and the second transmission line coupler form a coupling network; and
wherein the coupling network is configured to one or more of:
drive the core out-of-phase at the gate and source terminals of the transistor differential pair;
allow the source and drain terminals of the transistor differential pair to swing in-phase; and
provide a non-zero DC voltage for the gate terminals and a DC ground for the source terminals.

* * * * *